United States Patent [19]

Kim

[11] 3,755,752

[45] Aug. 28, 1973

[54] BACK-TO-BACK SEMICONDUCTOR HIGH FREQUENCY DEVICE

[75] Inventor: Chung K. Kim, Lexington, Mass.

[73] Assignee: Raytheon Company, Lexington, Mass.

[22] Filed: Apr. 26, 1971

[21] Appl. No.: 137,373

[52] U.S. Cl. ........ 330/34 R, 331/107 T, 331/107 G, 317/235 R, 317/235 UA, 317/234 G, 317/234 A, 332/167, 330/61

[51] Int. Cl. ............................ H03f 3/10, H03f 3/12

[58] Field of Search ...................... 317/234, 1, 4, 10, 317/31, 47; 340/173 LM; 332/16, 29, 30 V, 16 T; 331/107 T, 107 G; 307/320; 330/34, 61

[56] References Cited

UNITED STATES PATENTS

| | | | |
|---|---|---|---|
| 3,360,851 | 1/1968 | Kahng et al. | 317/235 UA |
| 3,443,169 | 5/1969 | Foxell et al. | 317/235 UA |
| 3,457,471 | 7/1969 | Moroney et al. | 317/234 A |
| 3,509,567 | 4/1970 | Bulman | 317/234 V |
| 3,515,952 | 6/1970 | Robinson | 317/234 A |
| 3,673,514 | 6/1972 | Coleman et al. | 317/234 V |
| 3,675,161 | 7/1972 | Teramoto et al. | 317/234 UA |
| 3,689,900 | 9/1972 | Chen | 317/235 UA |

OTHER PUBLICATIONS

Symposium on GaAs, by Riley, pages 173–179.

*Primary Examiner*—John W. Huckert
*Assistant Examiner*—Andrew J. James
*Attorney*—Milton D. Bartlett, Joseph D. Pannone, Herbert W. Arnold and David M. Warren

[57] ABSTRACT

A microwave semiconductor system in which a transistor, tunnel diode, avalanche diode, or transferred electron oscillator (Gunn effect) is formed as a plurality of substantially electrically symmetrical semiconductor devices connected in series and supported on the same heat sink. The active regions of the devices are formed of uniformly doped semiconductor material. The width of said active regions is less than ten times the thickness of the active regions and the length of said regions is greater than ten times said thickness, with the heat sink extending beyond the edges of the active regions.

22 Claims, 5 Drawing Figures

BACK-TO-BACK SEMICONDUCTOR HIGH FREQUENCY DEVICE

RELATED CASES

U.S. Pat. application Ser. No. 133,642 filed Apr. 13, 1971, now U.S. Pat. No. 3,668,512, by the same inventor and assigned to the same assignee as this invention is hereby incorporated by reference and made a part of the disclosure of this invention.

BACKGROUND OF THE INVENTION

Microwave semiconductor devices, in general, are low impedance loads for power supplies and the input capacitance to such devices is undesirably high in high power microwave semiconductor devices since it reduces the rate at which DC power input may be varied, for example for pulsing or modulating such devices.

In addition, microwave semiconductor devices have been formed by an epitaxially grown layer of high resistance semiconductor material on a wafer of low resistance semiconductor material of the same conductivity type. When such devices are to be used as avalanche diodes or Gunn oscillators, the interface of the epitaxial layer to the original wafer slice has created noise, which may be due to irregular changes in the impurity gradient in this region and/or to imperfections in the bulk material which carry through into several epitaxial growth layers of the crystal lattice structure.

SUMMARY OF THE INVENTION

This invention discloses that the microwave power output level of a semiconductor microwave system may be substantially increased by forming a plurality of semiconductor devices as back-to-back junction devices having a common electrical connection through a common heat sink. Such devices are preferably electrically symmetrical in that they will achieve microwave amplification and/or oscillation when a power supply voltage is applied in either direction across the devices. An additional advantage of a back-to-back device is that the semiconductor material may be formed directly by thinning a wafer of a grown semiconductor ingot without forming an epitaxial layer, thereby reducing the cost and improving the reproducibility of the device.

More specifically, this invention discloses back-to-back Schottky barrier avalanche devices formed by slicing a wafer of sufficient thickness to permit processing without breakage from a grown ingot of semiconductor material having the desired carrier concentration and impurity type for the active regions of the finished device, forming an electrically conductive heat sink on one surface of the wafer, thinning the wafer, for example by lapping or etching the other surface of the wafer, to less than 10 microns in thickness so that the active regions of the semiconductor devices will extend through the major portion of the thickness of the wafer, forming a plurality of active regions in the wafer having widths less than ten times the thickness of the wafer and lengths greater than 10 times the thickness of the wafer with the heat sink extending beyond the active regions and forming electrical contacts on the surface of said semiconductor wafer portions opposite to said heat sink.

A voltage applied between two of such contacts on the opposite side of said devices from said common heat sink produces current flow from one of said contacts through one of the semiconductor devices in one direction, through the heat sink, and through the other semiconductor device in the opposite direction causing both such devices to operate as microwave amplifiers and/or oscillators.

For the purposes of this invention, the semiconductor regions may be either homogeneous bulk material or an epitaxial layer 10 microns or more thick on a N+ semiconductor substrate with all of the substrate material subsequently removed by lapping or etching after a heat sink has been formed on the epitaxial layer.

Other and further objects and advantages of this invention will become apparent as the description thereof progresses, reference being had to the accompanying drawings wherein.

Figure 1:
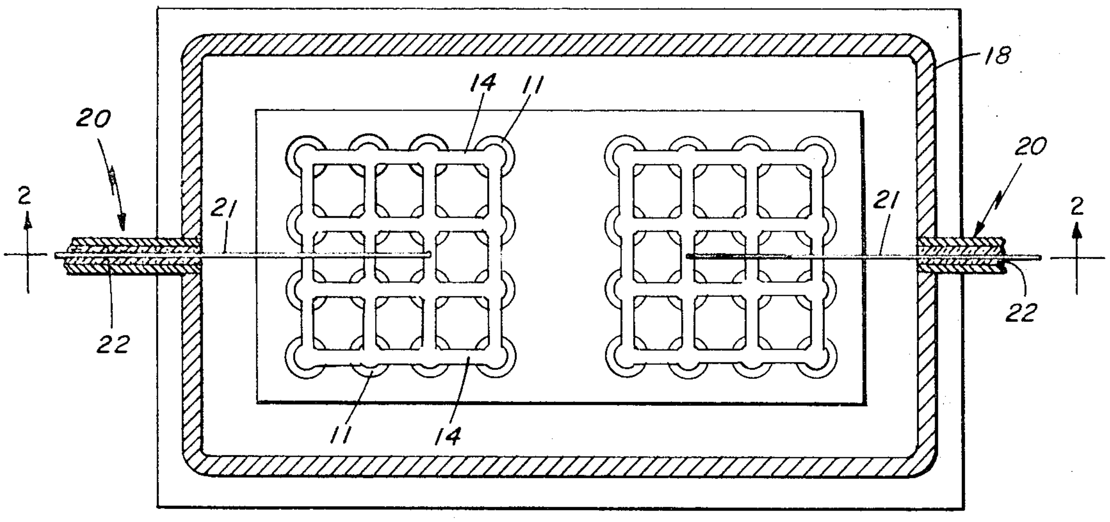
FIG. 1 illustrates a transverse cross-sectional view of an embodiment of the invention taken along line 1—1 of FIG. 2.
Figure 2:
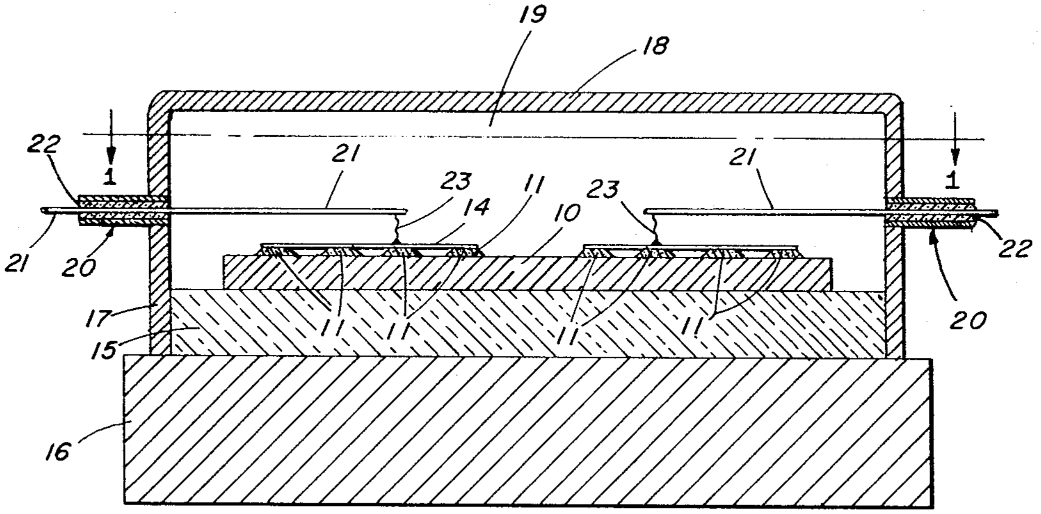
FIG. 2 illustrates a vertical sectional view of the device illustrated in FIG. 1 taken along line 2—2 of FIG. 1.
Figure 3:
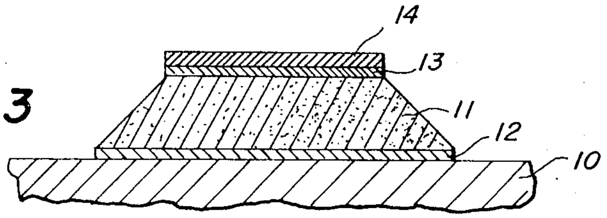
FIG. 3 illustrates an expanded cross-sectional view of a portion of the semiconductor electrode region of the device illustrates in FIGS. 1 and 2.

Referring now to FIGS. 1 through 3, there is shown a flat slab 10 of any desired material having good thermal and electrical conductive properties such as, for example, gold. Slab 10 is of any desired size and as shown here supports two regions of continuously connected semiconductor material 11. Slab 10 may be, for example, 65 mils in width and 130 mils in length and have a thickness of from 7 to 10 mils.

The regions of semiconductor material which may be, for example, gallium arsenide, silicon or indium phosphide, or any other desired semiconductor material, are as indicated herein a series of elongated portions having a width of less than 10 times their thickness and a length of greater than 10 times their thickness. For example, in the embodiment disclosed herein, the semiconductor regions are each made up of two series of four elongated portions, which extend in mutually orthogonal directions and intersect to form a matrix. Each of the portions has a width in the region adjacent the slab 10 of approximately 50 microns and a length of approximately 750 microns so that only a small percentage of the total surface area of the slab 10 is covered by the active semiconductor regions.

Slab 10 acts as a heat sink for the device and, due to the elongated configuration of the regions, a substantial portion of the heat, which would otherwise flow substantially entirely in a direction normal to the surface of the slab 10, will flow in a direction having a component parallel to the surface of the slab 10, thereby increasing the total heat flow for a given temperature gradient between the semiconductor regions 11 and the slab 10.

Positioned between the elements 11 and the slab 10 is a layer 12 of metal, such as platinum, which acts as an electrode for the formation of the slab 10 by electroplating in a manner to be described presently and also acts as a barrier to prevent diffusion of the gold from the heat sink 10 into the semiconductor regions 11 in the event that the devices are subject to elevated temperatures either during subsequent processing of the device or during operation of the device. Positioned on the opposite side of the semiconductor regions 11 from the heat sink 12 is another barrier layer 13 of platinum on which is formed an electrode layer 14.

The semiconductor material 11 may be, for example, N type gallium arsenide having a carrier concentration in the range of $10^{14}$ to $5 \times 10^{17}$ carriers per cubic centimeter. If the regions 11 are formed from a wafer of grown ingot of single crystal gallium arsenide, the carrier impurity is preferably sulphur, whereas if semiconductor material is formed by epitaxial growth on such a wafer, the carrier impurity is preferably tellurium. It is, however, contemplated that any desired impurity may be used to achieve the desired carrier concentration.

As indicated in FIG. 2, slab 10 is mounted on an insulating base 15 which is a good thermal conductor, such as beryllium dioxide, which extends beyond the edges of the slab 10. Insulating layer 15 has a thickness dependent on the microwave impedance characteristics desired and preferably is between one twentieth of an inch and one-half inch in thickness. Layer 15 is mounted on the bottom 16 of a conductive chamber having end walls 17, a top 18 and side walls 19. Coaxial input lines 20 are attached to the end walls 17 and have inner conductors 21 which extend into the chamber. Solid dielectric 22 is positioned between the outer and inner conductors.

One of the inner conductors 21 is connected to one of the layers 14 by a thin wire 23, for example, by thermal compression bonding or by any other desired process, the other inner conductor 21 is connected to the layer 14 of the other semiconductor device 11 by a thin wire 23 in a similar manner. Cover 18 which may, if desired, be removable, is attached, for example, by soldering to the end walls 17 and side walls 19, and the space above the semiconductor device may be filled with insulating material, such as an epoxy, resin or it may be filled with a gas or if desired evacuated.

DESCRIPTION OF SYSTEMS EMBODYING THE INVENTION

Figure 4:
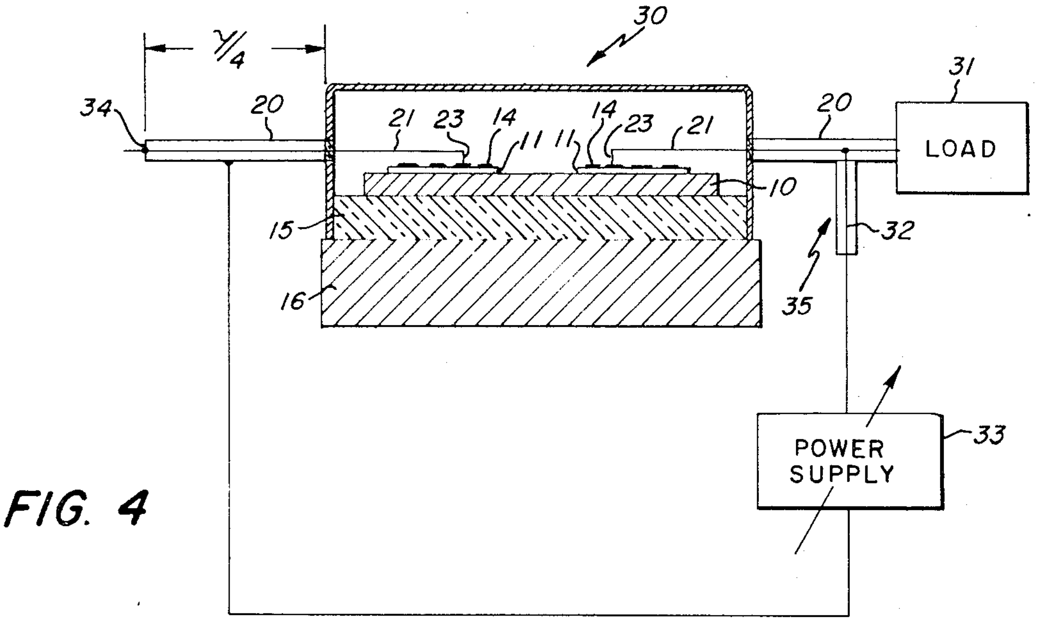
FIG. 4 illustrates an embodiment of the invention showing the device of FIGS. 1 through 3 operated as an oscillator coupled to a load.

Referring now to FIG. 4, there is shown an oscillator using a device 30, of the type shown in FIGS. 1 through 3, in which the coaxial lines 20 have inner conductors 21 connected to layers 14 of semiconductor device. One of the coaxial lines feeds a load 31 which may be of any desired type, such as an antenna, or a cavity in which material to be heated may be placed.

A conductor 32 is connected to conductor 21 which extends out of coaxial line 20 through an RF choke which may be, for example, a quarter wave section of coaxial line indicated at 33. Conductor 32 is connected to a power supply 33 which is preferably of the constant current variety and may be adjustable in order to adjust the power output of the device.

The other side of power supply 33 is connected to the outer conductor 20 of the other coaxial line whose length is made approximately one quarter wave long at the operating frequency of the device and whose inner conductor 21 is shorted to the outer conductor at the end of line 20 by a shorting plate 34. Due to the supply mismatches which will occur in the device, reflections will occur from load 31 back through the amplifying structure comprising the semiconductor regions 11 to be reflected substantially entirely by the quarter wave shorted coaxial line. As a result, the system will oscillate at a frequency determined by the length of the shorted coaxial line which, if desired, may be made adjustable in length as indicated. The oscillation will occur at the overall resonance frequency of the system, and the actual length of the shorted coaxial line may be somewhat different from an exact quarter wave length so that the semiconductor device will see an effective electrical quarter wave length looking back through the coaxial line 20 to the shorting plate 34.

The thickness of the insulating member 15 is chosen so that the heat sink 10 and the bottom wall 16, which may act as a cold plate, is a parallel plate transmission line whose characteristic impedance is preferably substantially equal to that of the characteristic impedance of the coaxial lines. However, it is contemplated that when the system is to be operated as an oscillator as indicated herein, impedance mismatch of the coaxial lines may be used. The overall impedance mismatch between the semiconductor devices 11 and the load 31 is preferably the minimum at which energy reflected from the load end of the device 30, will be amplified by the device 30, rereflected by the shorting plate 34 and reamplified by the device 30 to produce an overall loop gain greater than unity.

Figure 5:
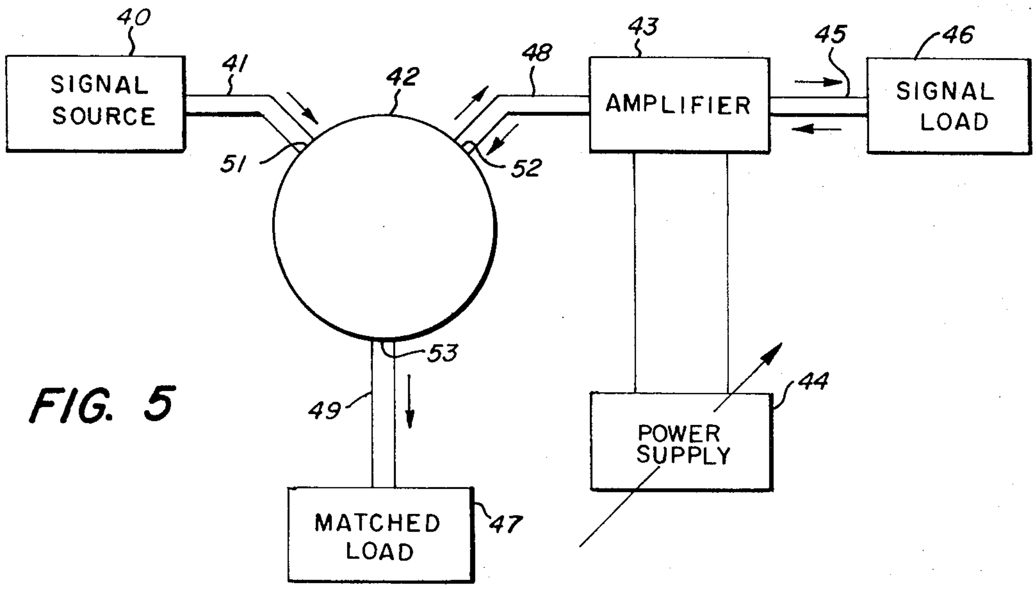
FIG. 5 illustrates an embodiment of the invention showing the device of FIGS. 1 through 3 in a system for amplifying an external microwave signal.

Referring now to FIG. 5, there is shown an amplifier in which a signal source 40 is coupled through a line 41 to one input 51 of a three-port circulator 42 of a conventional type such that said signal is coupled out of second port 52 to the input coaxial line 48 of an amplifier 43 which may be a device of the type illustrated in FIGS. 1 through 3. Amplifier 43 is fed by a constant current adjustable power supply 44 and has its microwave energy output coupled by a coaxial line 45 to a signal load 46 such as an antenna or a subsequent amplifier stage. Any energy reflected back from signal load 46, and/or amplifier 43 or coaxial lines 48 and 45 will pass through the third port 53 of circulator 42 to a coaxial line 49 coupled to a matched load 47, thereby preventing reflections back through the amplifier 43. For such an application, the input and output to amplifier 43 are preferably impedance match as closely as possible over the desired operating frequency range, and the power supply 44 is adjusted, to a current level preferably just below that at which oscillations will be excited, to achieve optimum gain of the system.

METHOD OF FORMING THE PREFERRED EMBODIMENT

A wafer of gallium arsenide a few mils thick is sliced from a grown single crystal of gallium arsenide doped with sulphur to a carrier concentration on the order of $10^{14}$ to $5 \times 10^{17}$ carriers per cubic centimeter. If desired, the wafer may have an epitaxial layer grown on one surface thereof which is greater than 10 microns thick and is doped with tellurium to a carrier concentration in the range of $10^{14}$ to $5 \times 10^{17}$ carriers per cubic centimeter and in this event, the doping concentration of the initial wafer slice is not critical and may, for example, be undoped.

As shown in FIG. 3, one surface of the wafer, which if an epitaxial layer is used is the exposed surface of the epitaxial layer, is coated with a layer of metal 12 which will form a Schottky barrier junction with the gallium arsenide. As disclosed herein, the layer is platinum 0.4 microns thick formed by vacuum deposition, sputtering or plating. A heat sink 10 of gold or any other material is formed on layer 12 by plating or any other desired process. The layer 10 should be a material which is a good thermal and electrical conductor. The process of deposition of layers 10 and 12 is preferably carried out at temperatures below that at which any substantial change occurs in the crystal lattice structure of the semiconductor material and below that at which any substantial diffusion might occur from the gold 10 through imperfections in the layer 12. The thickness of the heat sink layer 10 is sufficient to provide good mechanical support for the semiconductor body 11 and is preferably at least several mils thick.

The surface of the body 11 opposite to that coated with layer 12 is lapped or etched, for example with a solution of $H_2SO_4$, $H_2O_2$ and $H_2O$, to thin the wafer to a thickness of, for example, less than 10 microns. In the case of a wafer having an epitaxial layer, the wafer is preferably thinned sufficiently for all of the original N+ wafer material to be removed such that the semiconductor material remaining has all been formed epitaxially and preferably of a uniform carrier density.

The exposed semiconductor surface of the wafer is then coated with a layer 13 of platinum, for example 0.4 microns thick, and a layer of gold 14 approximately 0.5 microns thick which provides for a uniform distribution of the input voltage across the entire region 11.

A mask is formed on layer 14 by conventional photoresist techniques to expose the area where the body 11 and the layers 12, 13 and 14 are to be removed. These layers are then removed by subjecting the wafer successively to appropriate etchants to etch the materials in accordance with well-known practice. The mask is then dissolved and the wafer diced to form a number of individual structures like that shown in FIGS. 1 and 2. Each such structure contains at least two continuous semiconductor regions 11 isolated from each other except through the heat sink 10. Layers 14 are then connected to inner conductor 21 of input and output coaxial lines 20 by thin wires 23 by thermo compression bonding.

What is claimed is:

1. In combination:

at least one body of semiconductor material having a substantially uniform carrier density throughout a plurality of active regions thereof; and electrodes comprising contacts for providing an electric field across said regions, at least one of said electrodes having portions extending in a direction parallel to said regions for a distance less than ten times the thickness of said regions and in another direction parallel to said regions for a distance substantially greater than ten times the thickness of said regions.

2. In combination:

at least one body of semiconductor material having an active region for producing amplification at microwave frequencies, said region extending in at least one direction substantially transverse to the average direction of motion of carriers in said region a distance which is less than 10 times the thickness of said region;

a heat sink thermally coupled to said region; and a plurality of electrodes spaced from said heat sink for coupling input power to said active region.

3. The combination in accordance with claim 2 wherein said amplification is produced by a periodic spatial variation in the density of charges in said region in an electric field across said region produced by a voltage applied to said electrodes.

4. The combination in accordance with claim 3 wherein a plurality of active regions are thermally coupled to a common heat sink.

5. The combination in accordance with claim 4 wherein said voltage is applied in series across said plurality of said regions.

6. The combination in accordance with claim 5 wherein said voltage is applied between a plurality of electrodes spaced from said heat sink by said semiconductor material.

7. The combination in accordance with claim 6 wherein said electrodes and said heat sink form junctions with said semiconductor material.

8. The combination in accordance with claim 7 wherein said devices are operated to produce carrier multiplication in the region adjacent those junctions which are reverse biased.

9. The combination in accordance with claim 8 wherein said semiconductor material comprises gallium arsenide.

10. The combination in accordance with claim 9 wherein said electrodes comprise platinum.

11. The combination in accordance with claim 10 wherein said heat sink comprises gold.

12. The combination in accordance with claim 11 wherein said heat sink is mounted on an electrical insulator having high thermal conductivity.

13. The combination in accordance with claim 12 wherein said electrical insulator is mounted on one wall of a cavity enclosing said semiconductor regions.

14. The combination in accordance with claim 13 wherein at least one conductor of a first high frequency transmission line is coupled through said cavity to a first of said electrodes contacting said semiconductor material.

15. The combination in accordance with claim 14 wherein said first high frequency transmission line is connected to a signal load.

16. The combination in accordance with claim 15 wherein a variable current power supply is connected between said electrodes which are spaced from said heat sink.

17. The combination in accordance with claim 16 wherein a second high frequency transmission line has at least one conductor connected to a second of said electrodes.

18. The combination in accordance with claim 17 wherein said second high frequency transmission line presents a frequency determining reactance to said semiconductor regions.

19. The combination in accordance with claim 17 wherein said second high frequency transmission line is fed by a signal source through a signal isolator.

20. The combination in accordance with claim 19 wherein said signal isolator comprises a ferrite circulator having at least three ports, a first of which is coupled to said signal source, a second of which is coupled to said second high frequency transmission line and third of which is coupled to a substantially impedance matched load over the range of operating frequencies of the system.

21. In combination:

a body of semiconductor material comprising a portion of a predetermined conductivity type having an active region disposed in said portion of said body between substantially uniformly spaced surfaces of the opposite sides of said portion of said body, said active region having a substantially uniform density of fixed impurity carriers throughout said active region; and a nonbarrier electrical connection at one of said surfaces on one side of said portion and rectifying electrical connection at the other of said surfaces for applying an electrical field through said active region, said region extending in one direction substantially parallel to said surfaces for a distance less than ten times the thickness of said region between the surfaces and in another direction substantially parallel to said surfaces for a distance at least greater than twice the thickness of said region between said surfaces.

22. In combination:

a body of semiconductor material having an active region for producing amplification at microwave frequencies disposed in said body between substantially uniformly spaced surfaces of the opposite sides of said body;

a plurality of electrical connections to said body for providing an electric field of a predetermined polarity through said active region, a nonbarrier electrical connection for said polarity at one of said surfaces on one side of said body and a back biased rectifying electrical connection for said polarity at the other of said surfaces, said active region extending in a direction substantially transverse to the average direction of motion of carriers in said region and to the average direction of said electrical field for a distance which is less than ten times the thickness of said active region and in another direction substantially transverse to the average direction of motion of carriers in said region and to the average direction of said field for a distance which is at least greater than twice the thickness of said active region; and a heat sink thermally coupled to said region and extending in said directions substantially beyond the edges of said active region.

* * * * *

UNITED STATES PATENT OFFICE
CERTIFICATE OF CORRECTION

Patent No. 3,755,752 Dated August 28, 1973

Inventor(s) Chung K. Kim

It is certified that error appears in the above-identified patent and that said Letters Patent are hereby corrected as shown below:

Column 1, line 6, delete "now U.S. Pat. No. 3,668,512,".

Column 2, line 24, "illustrates" should be -- illustrated --.

Column 7, line 8, Claim 21, after "and" insert -- a --.

Signed and sealed this 26th day of November 1974.

(SEAL)
Attest:

McCOY M. GIBSON JR.
Attesting Officer

C. MARSHALL DANN
Commissioner of Patents